United States Patent
Ishii et al.

(10) Patent No.: US 6,321,313 B1
(45) Date of Patent: Nov. 20, 2001

(54) MEMORY SYSTEM, MEMORY CONTROL SYSTEM AND IMAGE PROCESSING SYSTEM

(75) Inventors: Satoki Ishii, Yokohama; Yoshitsugu Inoue; Masahiro Yamada, both of Tokyo; Toru Noro, Yokohama, all of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/300,769

(22) Filed: Apr. 27, 1999

Related U.S. Application Data

(62) Division of application No. 08/514,863, filed on Aug. 14, 1995, now Pat. No. 5,923,829.

(30) Foreign Application Priority Data

| Aug. 25, 1994 | (JP) | 6-201147 |
| Sep. 20, 1994 | (JP) | 6-223859 |
| Dec. 21, 1994 | (JP) | 6-335505 |

(51) Int. Cl.$^7$ .............. G06F 12/16; G06F 1/28; G11C 7/20
(52) U.S. Cl. .......... 711/163; 713/323; 713/324; 365/230.03; 365/227; 365/222; 711/106; 714/42; 714/5
(58) Field of Search ............ 365/222, 52, 230.03, 365/189.05, 230.08, 200, 227; 345/438, 439, 517; 714/1, 8, 7, 423, 5; 711/105, 106, 103, 163, 129, 153, 166, 173; 712/43, 38, 39; 713/320, 324, 323

(56) References Cited

U.S. PATENT DOCUMENTS

| 3,760,379 | * | 9/1973 | Nibby, Jr. et al. ........... 365/222 |
| 4,505,576 | | 3/1985 | Sugiura et al. ............... 345/531 |
| 4,641,197 | | 2/1987 | Miyagi ........................... 358/450 |
| 4,691,340 | | 9/1987 | Maeda et al. ................ 379/93.25 |
| 4,972,376 | * | 11/1990 | Torimaru et al. ............. 365/222 |
| 5,129,060 | | 7/1992 | Pfeiffer et al. . | |
| 5,165,071 | | 11/1992 | Moriya et al. . | |
| 5,226,008 | | 7/1993 | Aono . | |

(List continued on next page.)

FOREIGN PATENT DOCUMENTS 5120114   5/1993   (JP) .

OTHER PUBLICATIONS

NEC, IC Memory Dynamic RAM, 1994, Data Book, Document No. ID–3394, published Mar. 1994, printed in Japan by NEC Corporation, "16 bit Synchronous DRAM", pp. 777, 786, 787 and 808.

16M SDRAM User's Manual (provisional edition), Doc. No. SUD–W–0103–3, published Jun. 3, 1993 by Semiconductor Application Technology Division, Memory Technology Department, NEC Corporation, "Power–Down Operation", pp. 3–28.

*Primary Examiner*—Daniel H. Pan
(74) *Attorney, Agent, or Firm*—Cooper & Dunham LLP

(57) ABSTRACT

A determining unit determines which area in an SDRAM is the area in which image data is stored. According to the determination of the determining unit, a control unit activates a power-down mode only for an area in the SDRAM, the image data being stored in the area. In order to determine whether or not the data stored in the SDRAM is image data, a code is previously added to the relevant data. Whether or not the relevant data stored in the SDRAM is image data is determined by the determining unit using the added code. A minimum of only one bit does well as the code for determining whether or not the data stored in the SDRAM is image data. Instead of previously adding a code to relevant data, it is also possible, for the same purpose, to store a code in an internal register of the SDRAM, the code indicating contents of data stored in the SDRAM.

17 Claims, 8 Drawing Sheets

U.S. PATENT DOCUMENTS

| | | | |
|---|---|---|---|
| 5,268,865 | 12/1993 | Takasugi . | |
| 5,337,285 | 8/1994 | Ware et al. | 365/227 |
| 5,438,536 * | 8/1995 | Salzman | 365/52 |
| 5,450,130 | 9/1995 | Foley | 348/391.1 |
| 5,525,820 | 6/1996 | Furuyama | 257/296 |
| 5,577,236 | 11/1996 | Johnson et al. . | |
| 5,581,506 | 12/1996 | Yamauchi . | |
| 5,798,979 | 8/1998 | Toda et al. . | |
| 5,923,829 | 7/1999 | Ishii et al. . | |

* cited by examiner

MEMORY SYSTEM, MEMORY CONTROL SYSTEM AND IMAGE PROCESSING SYSTEM

This is a divisional of application Ser. No. 08/514,863 filed Aug. 14, 1995, now U.S. Pat. No. 5,923,829. Priority of application Nos. 6-201147; 6-223859 and 6-335505 filed in Japan on Aug. 25, 1994; Sep. 20, 1994 and Dec. 21, 1994. Applicant hereby claims priority under 35 U.S.C. §119.

BACKGROUND OF THE INVENTION

1. Field of the Invention

The present invention relates to a memory system, in particular, to a memory system including a synchronous dynamic random access memory (simply referred to as an 'SDRAM', hereinafter).

The present invention also relates to a memory control system for control of the memory system.

The present invention also relates to an image processing system such as a scanner apparatus, a printer, a duplicator (such as an electrophotographic duplicator), a facsimile apparatus and so forth. The memory system is as an image memory for storing image data therein.

2. Description of the Related Art

In the related art, a dynamic random access memory (simply referred to as a 'DRAM', hereinafter) has been used as the memory system in the image processing system which controls storage and reading of image information. In this technical field, as high-speed information processing of a micro CPU and a printer has been achieved, it is required to enlarge the capacity for storing image information and, also provide for high-speed storage of image information. A static random access memory (simply referred to as a 'SRAM', hereinafter) has been used recently in order to achieve high-speed storage of image information. However, in order to improve resulting image quality, storage capacity is required to be further enlarged and, thus, power consumption for the storage is increased which leads to increased costs.

When the large-capacity DRAM and high-speed operating SRAM are used for storing image information, the maximum power consumption for refreshing the DRAM is large and, thus, an extra power supplying system may be required and costs for a power supplying unit increase. Thus, the size of the entire system may be enlarged.

In the related art, a DRAM in a high-speed page mode or in a static column mode is used as an image memory in order to achieve a low-cost, large-capacity image memory.

It is possible to perform random access in high speed on the high-speed-page-mode DRAM to the same address by re-inputting column address strobe (the term "column address strobe" will be abbreviated as "CAS", hereinafter) and a column address in which asserting of row address strobe (the term "row address strobe" will be abbreviated as "RAS" hereinafter) is kept.

Similarly, it is possible to perform high speed access on the static-column-mode DRAM to a same-line address by changing a column address in which asserting of the RAS is kept. Further, because it is not necessary to strobe a column address using CAS, high speed access can be achieved.

In a nibble-mode DRAM, sequential access to data at an address as a result of incrementing the two least significant bits is performed when CAS is toggled in a state in which asserting of RAS is kept after finishing an ordinary access. Although burst access can be performed for only four words in the nibble-mode DRAM, high-speed access can be performed in comparison to the other-mode DRAMs.

However, a possible high-speed access in this case corresponds to be a cycle time on the order of 40 nanoseconds (25 MHz) at the most. If further improvement of the access speed is to be performed, it is necessary to increase bus width or to use an expensive SRAM. If bus width is increased, improvement of access speed is possible. However, various problems arise such as the relevant control circuit becoming complicated, delay time becoming longer, and a non-dividable unit of the relevant memory system being enlarged.

Recently, an SDRAM has been proposed in Japanese Laid-Open Patent Application No.5-120114. The SDRAM was obtained by making the above-described DRAM be a completely synchronous type. In use of the SDRAM, entry and refreshing of a load address and a column address is performed by inputting a relevant command at the rising edge of a clock pulse.

In detail, with regard to data reading, although the time required for accessing a first data is the same as that in the DRAM case, subsequent data is output for each clock pulse. The order in which data is sequentially accessed in this time is predetermined as a result of mode setting and, thus, it is not necessary to input a relevant column address for each clock pulse.

With regard to data writing, data can be input for each clock pulse from first data. Further, frequency of the clock pulses is high, specifically 100 MHz. Therefore, high-speed access can be achieved.

Further, because the SDRAM is of the completely synchronous type, a relatively simple circuit can do well as a relevant control circuit. In fact, an input signal can be easily produced by producing a signal which only has a timing for providing a condition of set-up time and hold time for a relevant one of the clock pulses. (With regard to details of the set-up time and the hold-time, see NEC, IC Memory Dynamic RAM, 1994, Data Book, page 808.) The timing of an output signal can be easily known from the timing of the clock pulses.

Thus, by using the SDRAM, it is possible to provide a memory system by which the information processing rate of a relevant CPU can be improved.

As mentioned above, entry and refreshing of a load address and a column address is performed by inputting a relevant command at a rising edge of a clock pulse in use of the SDRAM. Further, when a power-down mode activating/deactivating command and self-refreshing command is input using a clock enable signal (CKE), a register for inputting the power-down mode activating/deactivating command and self-refreshing command is provided in an ASIC which controls the memory. The power-down mode is a mode which may be activated in an active stand state (after a bank active command is written) or in a precharge standby state (after a precharge command is written) in the SDRAM. The power-down mode can be activated by causing the CKE signal to be at a low level, and by activating the power-down mode, energy consumed in the SDRAM can be saved. A CPU may write a relevant command in the register and thus entry and activating the power-down mode and execution of self-refreshing may be performed. Thus, the memory control system is complicated. (With regard to a detail of the power-down mode and CKE signal, see NEC, IC Memory Dynamic RAM, 1994, Data Book, Document No.ID-3394, published March 1994, printed in Japan by NEC Corporation, '16M bit Synchronous DRAM', pages 777, 786, and 787, and 16M SDRAM User's Manual (provisional edition) (written with the Japanese language), Doc.No.SUD-W-0103-3, published Jun. 3, 1995, by Semiconductor Application Technology Division, Memory Technology Department, NEC corporation, Page 3–28, 'Power-Down Operation' (command No14).)

Further, time is required for activating and deactivating the power down mode. Therefore, if an SDRAM is used for storing data, such as instruction data, which is written in and read out relatively frequently, applying the power-down mode to such an SDRAM may degrade the writing/reading speed. If a memory monitoring circuit is provided so as to determine whether or not a particular SDRAM is used for storing data which is written in and read out relatively frequently, it is possible to activate the power-down mode appropriately depending on frequency of use of the memory. However, the provision of such a memory monitoring circuit makes the memory control system complicated.

Further, once activating/deactivating of the power-down mode are specified for an area of the memory, the activating/ deactivating of the power-down mode are performed regardless of contents of data stored in the area of the memory.

Further, when the power-down mode is used for the SDRAM , it is necessary to cause the clock enable signal (CKE) to change at high speed so as to activate and deactivate the power-down mode in a precisely appropriate timing. The clock enable signal (CKE) can be used to invalidate a rising edge of the clock pulses as well as for controlling activating/deactivating of the power-down mode. However, invalidating a rising edge of the clock pulse is not needed in all systems. Hardware provided for control of the clock enable signal (CKE) can be simplified in a case where invalidating a rising edge of the clock pulse is not needed. However, even in this case, it is necessary to control the clock enable signal (CKE) at high speed in order to effectively use the power-down mode.

In particular, when many SDRAMs are used as an image memory for storing image data, the clock enable signal (CKE) is to be supplied for a large amount of load. For this purpose, buffering is performed. Further, different from the cases of the RAS, CAS signals, the clock enable signal is to provide condition for a set-up time and a hold time for a rising edge of a relevant one of the clock pulses.

When a relevant control circuit for the SDRAMs is provided by an ASIC, many external pins are used for communicating the clock enable signals (CKE) or, an external high-speed buffer or D-flip-flop-is to be provided. Further, many signal wires are present and high wave quality of the signals communicated through the signal wires is essential.

If the SDRAM is used as an image memory, because it is not necessary that image data is always present in an image forming operation, it is unnecessary to always store contents present in the memory.

SUMMARY OF THE INVENTION

A first object of the present invention is to provide an efficient memory control system by which activating/ deactivating of the power-down mode can be performed, depending on the contents of the data stored in the memory, through a relatively simple system.

A memory control system according to the present invention comprises memory means for storing image data; and control means for activating a power-down mode only for an area in said memory means, the image data being stored in said area.

It is preferable that the system further comprises determining means for determining which area in said memory means is the area in which the image data is stored.

In the system, said memory means may comprise a synchronous dynamic random access memory.

A second object of the present invention is to provide a memory system and then an image processing system using such a memory system, in which the amount of hardware can be reduced, the number of signal wires can be reduced, and a high wave quality of signals communicated through the signal wires being provided. Further, power consumption can be reduced, and it is possible to activate the power-down mode only at a defined area, when storage of data stored at this area is needed.

A memory system according to another aspect of the present invention comprises plurality of synchronous dynamic random access memories for storing image data; and control means for causing an input level of clock enable terminals of part of said plurally of synchronous dynamic random access memories to be fixed at a high level.

Another image processing system according to the other aspect of the present invention comprises a memory system which comprises a plurality of synchronous dynamic random access memories for storing image data; control means for causing an input level of clock enable terminals of part of said plurally of synchronous dynamic random access memories to be fixed at a high level; and wherein said memory system is connected to a printer via a printer interface.

A third object of the present invention is to provide an image processing system which uses the high-speed operating SDRAM for storing image information. Further, when the SDRAM is refreshed, only a part of the SDRAM is refreshed and thus power consumption can be reduced. Thus, it becomes possible to improve information storage speed and storage capacity, and reduce costs for the system.

An image processing system according to another aspect of the present invention comprises a plurality of memory elements for storing image information; and refreshing means for refreshing part of said plurality of memory elements.

In the system, the part of the plurality of memory elements may comprise a part where the image information is stored.

In the system, the plurality of memory elements may comprise a plurality of synchronous dynamic random access memories.

Other objects and further features of the present invention will become more apparent from the following detailed description when read in conjunction with the accompanying drawings.

DETAILED DESCRIPTION OF PREFERRED EMBODIMENTS

Figure 1:
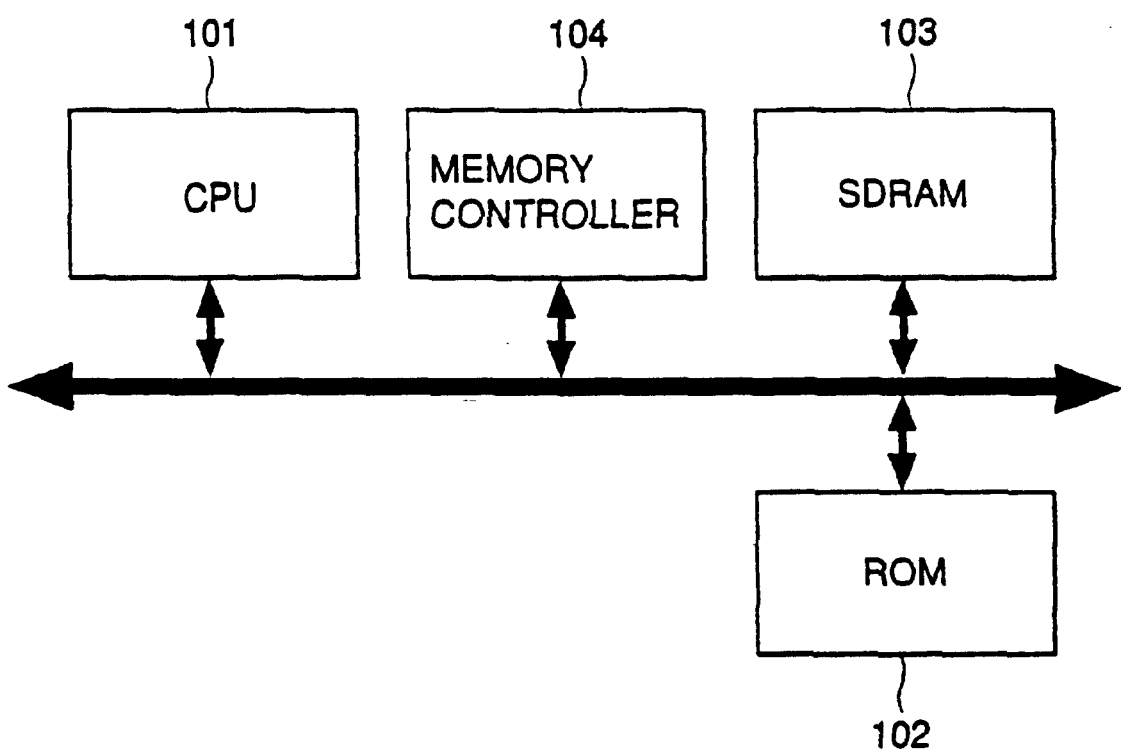
FIG. 1 shows a block diagram of an input/output system in a first embodiment of a memory control system according to the present invention.

An input/output system in a first embodiment of the present invention will now be described. FIG. 1 shows a block diagram of the input/output system. The input/output system may be used in an image forming system in a scanner, printer or the like.

As shown in the figure, the memory system includes a CPU (Central Processing Unit) 101 for controlling the entirety of the system, processing image information, and so forth. The memory system further includes a ROM 102 for storing programs which the CPU 101 executes, various parameters and so forth The memory system also includes a SDRAM 103 which is used as an image memory and stores image data which is produced as a result of processing of the CPU 101 in accordance with print data or the like.

The SDRAM 103 used as the image memory includes a plurality of SDRAM chips. Ordinarily, when such an SDRAM is used as the image memory, the number of plurality of SDRAM chips depends on a particular required storage capacity, and ordinarily, the SDRAM includes 8 or 12 chips.

The memory controller 104 performs the activating/deactivating of the power-down mode.

In addition that the image data is stored in the SDRAM 103 as mentioned above, instruction data (indicating instructions) is also stored in the SDRAM 103. The frequency of use of the SDRAM 103 for the image data is lower than the frequency of use for the instruction data. In other words, once the image data is stored in the SDRAM 103, the storage of the image data therein is retained and not used for a long period, in comparison to the storage of the instruction data. Therefore, if it is possible for activation/deactivation of the power-down mode to be performed only for the image data, it is possible to provide an energy-saving, efficient memory control system. Thus, activating/deactivating the power-down mode only for the image data is very advantageous for a system which processes image data such as the input/output system used in the image forming system.

In the first embodiment, means are provided for determining contents of data stored in a memory area of the SDRAM 103 which is used as the image memory. Based on a result of the determination, it is determined whether or not the power-down mode is activated.

In order to determine whether or not the data stored in the SDRAM 103 is image data, a code is previously added to the relevant data. The CPU 101 determines, via the memory controller 104, whether or not the relevant data stored in the SDRAM 103 is image data using the added code. A minimum of only one bit does well as the code for determining whether or not the data stored in the SDRAM 103 is image data.

Thus, whether or not the data stored in the SDRAM 103 is image data is determined using the above-mentioned code, and then the memory controller 104 activates the power-down mode only for an area in the SDRAM 103 in which image data is stored based on the determination made by use of the code.

Instead of adding a code to the relevant data, it is also possible, for the determination purpose, to store a code in an internal register of the SDRAM 103, the code indicating contents of data stored in the SDRAM 103.

According to the first embodiment of the present invention, a means is provided for determining contents of data stored in a memory area of the SDRAM 103 as mentioned above. As a result, when an allocation of the memory area of the SDRAM 103 is changed, activation of the power-down mode can be performed appropriately only for an area of the SDRM 103 in which image data is currently stored.

As mentioned above, the SDRAM includes a plurality of SDRAM chips, and in a case, for example where a 32-bit CPU controls the SDRAM, a plurality of SDRAM chips are used for storing one word (32 bits) of data. In such a case, the above-described means, for determining contents of data stored in a memory area of the SDRAM determines one SDRAM chip among the plurality of SDRAM chips allocated for storing one word of data. As a result of one-chip determination, it is possible to determine the contents stored in the plurality of chips for one word of data. Thus, determination as to whether or not the power-down mode is activated on a plurality of SDRAM chips can be performed simply. Thus, the determination as to whether or not the power-down mode is applied on SDRA chips may be performed for each a block of chips allocated for storing a minimum unit of data.

If the means for determining contents of data stored in a memory area of SDRAM chips determines the area of empty, it is determined to activate power-down mode for the memory area.

Figure 2:
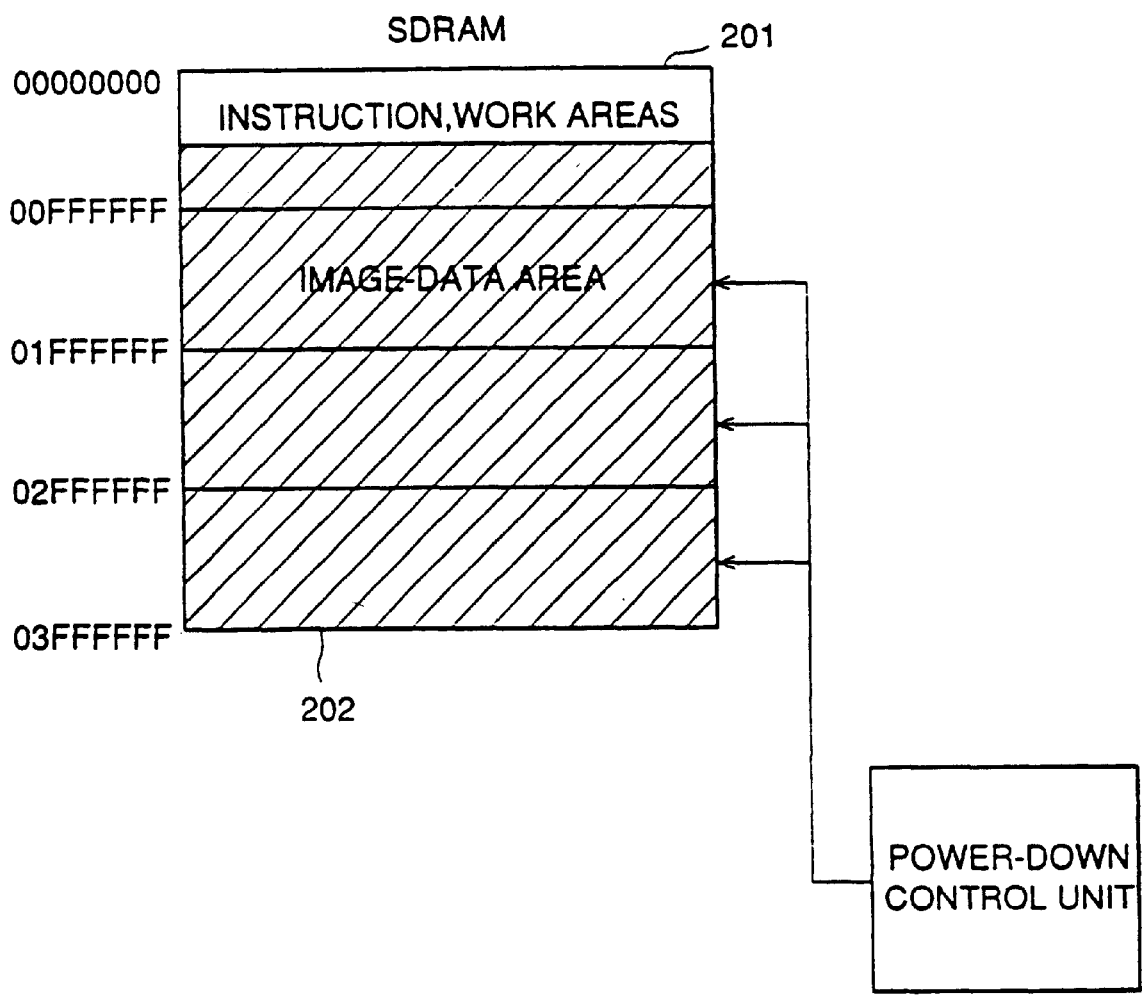
FIG. 2 illustrate a concept of a second embodiment of a memory control system according to the present invention.

A second embodiment of the present invention will now be described with reference to FIG. 2. In the second embodiment, a specific area such as area 201 in an SDRAM is previously determined as being an area for which the power-down mode is never activated. Then, in an initial setting operation for the SDRAM, an instruction area and a work area such as a stack are set in this specific area 201. An image-data area is set in an area 202, which is the memory area of the SDRAM remaining after allocating the specific area 201 therein. This area 202 is an area for which the power-down mode may be activated.

According to this second embodiment, it is not necessary to particularly determine, for the specific area 201, whether or not the power-down mode is activated. Further, control of the clock enable signal is not needed for the specific area 201 because it is predetermined that the power-down mode is never activated for the specific area 201. As a result, it is possible to effectively reduce the control circuit for controlling activation/deactivation of the power-down mode. Thus, the power-down mode is advantageously controlled only for the necessary memory area of the SDRAM, which area may store image data.

A third embodiment of the present invention will now be described. In the third embodiment, the entire memory area of the SDRAM is specially used as the image-data area.

In such a case, a relevant signal such as the clock enable signal (CKE) is controlled so that the power-down mode is activated for the memory area of the SDRAM in an initial setting stage of the SDRAM. When image data for drawing an image is sent to the SDRAM, the power-down mode is deactivated and the SDRAM is used as a frame memory. Then, after it has been determined that the drawing of the image has been finished, the power-down mode is again activated for the memory area of the SDRAM. The timing for which the power-down mode is again activated may be a time at which a sheet having the image printed thereon has been ejected from a printer in a case where the relevant memory control system is applied to a printer. Therefore, it is possible to effectively use the power-down mode for the area in which the image data is stored.

According to the third embodiment, among the chips of the SDRAM, certain chips are used to store data such as instruction data which is frequently used. These chips are predetermined to be the ones for which the power-down mode is never activated. SDRAM chips, which are especially used for storing image data, which is not frequently used, generally are predetermined to be the ones for which the power-down mode is initially activated. Thus, it is possible to effectively reduce the rate of power consumption.

The third embodiment will now be described specifically using an memory area arrangement such as that shown in FIG. 2. In this example, a memory area of addresses '03000000' through '03FFFFFF' of the SDRAM is predetermined to be specially used for storing image data. In this case, according to the above-described third embodiment of the present invention, the power-down mode is initially activated for this memory area of addresses '03000000' through '03FFFFFF' by the power-down control unit.

Further, in this example, the memory area 201, which is half of a memory area of addresses '00000000' through '00FFFFFF', is predetermined to be specially used as an instruction area. In this case, it is not necessary to provide a control circuit for activating the power-down mode for this area 201.

Further, a part of the other half of the area of addresses '00000000' through '00FFFFFF' is predetermined to be used at least currently for an instruction area and the remaining part thereof is predetermined to be used at least currently for a work area used by the CPU. For this area, a control circuit for activating the power-down mode is provided but is not activated. For this area, if allocation is changed so that this area is used for storing image data, it is possible to activate the power-down mode appropriately using the control circuit provided.

The area of addresses '01000000' through '01FFFFFF' is predetermined to be used as a work area used by the CPU, and a part of the area of addressed '02000000' through '02FFFFFF' is predetermined to be used as an image data storage area and the remaining part thereof is predetermined to be used as a work area used by the CPU. For these areas of '01000000' through '01FFFFFF' and '02000000' through '02FFFFFF', a control circuit for activating the power-down mode is provided and is activated appropriately depending on how these areas are used. Specifically, if these areas are only used for storing image data, the power-down mode may be activated. If a part of these areas is used as either an instruction area or a work area used by the CPU, the power-down mode may not be activated for these areas.

In another example, the SDRAM includes 12 SDRAM chips. The first two chips (Nos.1 and 2) are predetermined to be especially used as an instruction area. It is not necessary to provide a control circuit for activating the power-down mode for these chips. A part of the subsequent two chips (Nos.3 and 4) is predetermined to be used currently for an instruction area and the remaining part thereof is predetermined to be used currently for a work area used by the CPU. For these chips (Nos.3 and 4), a control circuit for activating the power-down mode is provided but is not activated. For these chips (Nos.3 and 4), if an allocation of areas is changed so that these chips are used for storing image data, it is possible to activate the power-down mode appropriately using the provided control circuit.

The subsequent two chips (Nos.5 and 6) are predetermined to be used as a work area by the CPU, and a part of the subsequent two chips (Nos.7 and 8) is predetermined to be used as an image data storage area and the remaining part thereof is predetermined to be used as a work area by the CPU. For these chips (Nos.5, 6, 7 and 8), a control circuit for activating the power-down mode is provided and is activated appropriately depending on how these chips are used. Specifically, if these chips (Nos.5, 6, 7 and 8) are only used for storing image data, the power-down mode may be activated. If a part of these chips (Nos.5, 6, 7 and 8) is used as either an instruction area or a CPU work area, the power-down mode may not be activated for these chips (Nos.5, 6, 7 and 8).

The last four chips (Nos.9, 10, 11 and 12) are predetermined to be especially used for storing image data. The power-down mode is initially activated for these chips (Nos.9, 10, 11 and 12) by the power-down control unit.

Thus, in the third embodiment, it is possible to effectively reduce the control circuit for activating the power-down mode and to effectively reduce power consumption in the SDRAM.

Thus, according to the present invention, activating/deactivating of the power-down mode which is a energy-saving mode can be performed, through a simple construction, depending on contents of data stored in the SDRAM. As a result, it is possible to provide a low power consumption, efficient memory control system.

Figure 3:
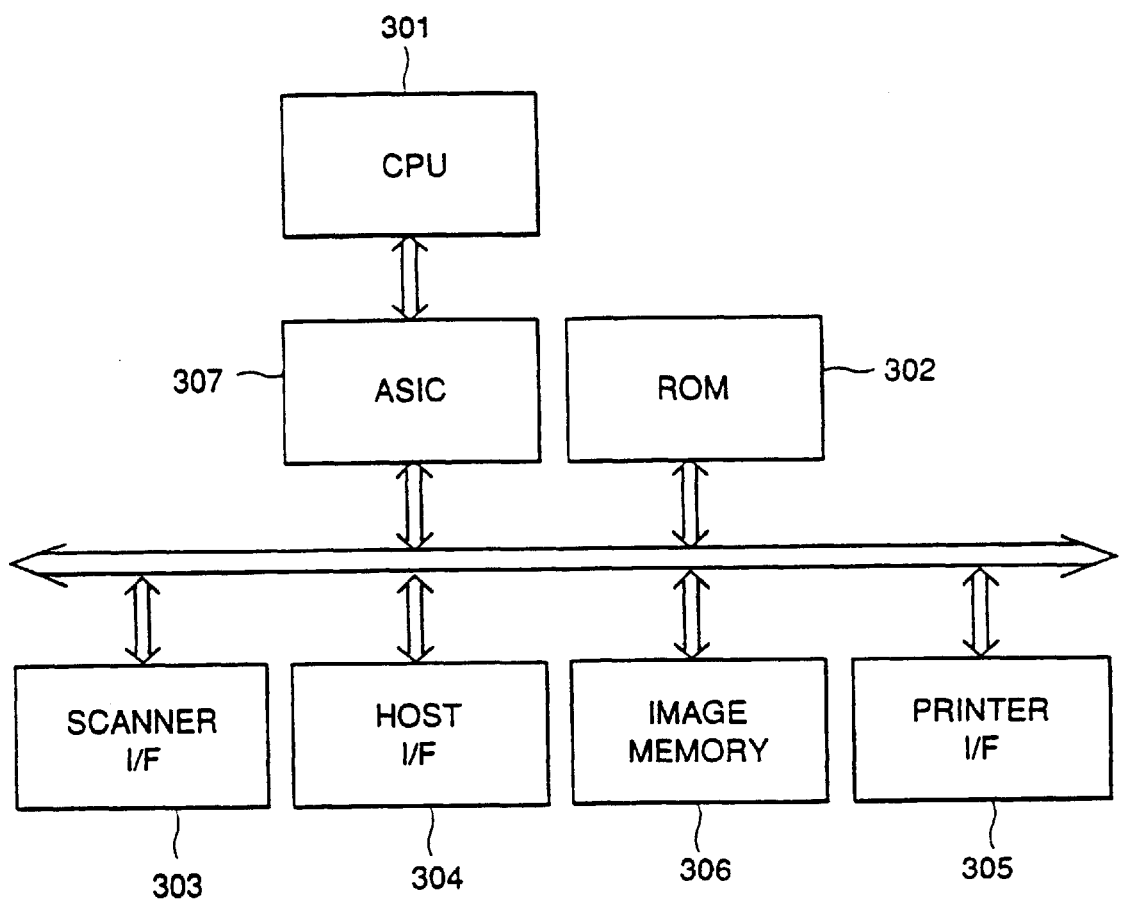
FIG. 3 shows a block diagram of an image forming system in a fourth embodiment of the present invention.

With reference to FIG. 3, an image forming system in a fourth embodiment of the present invention will now be described. FIG. 3 shows a block diagram of the image forming system.

In the image forming system shown in FIG. 3, a CPU (Central Processing Unit) 301 controls the entirety of a construction shown therein and performs image processing and so forth. The CPU 301 has a cache memory on a chip on which the CPU 301 is also provided. A ROM 302 stores programs which the CPU 301 executes, various parameters which the CPU 301 uses, and so forth.

A scanner interface 303 acts as an interface with a scanner device (not shown in the figure). A printer interface 305 acts as an interface with a printer (not shown in the figure).

An image memory 306 includes a plurality of SDRAM chips. As mentioned above, ordinarily, a number of the plurality of SDRAM chips depends on required storage capacity of an image memory, and is 8 or 12. The image memory 306 stores scanner data as image information, the scanner data being obtained as a result of being read by the scanner device and then appropriately processed by the scanner interface 303. The image memory also stores image data as image information input from a host apparatus (not shown in the figure) through a host interface 304.

The image memory 306, not only stores the image data, but also is used as a working memory of the CPU 301. Further, the image memory 306 is also used as a memory in which instructions are stored as a result of download thereof, a program being executed according to the instructions.

Image data stored in the image memory 306 is transmitted to the printer through the printer interface 305.

Figure 4:
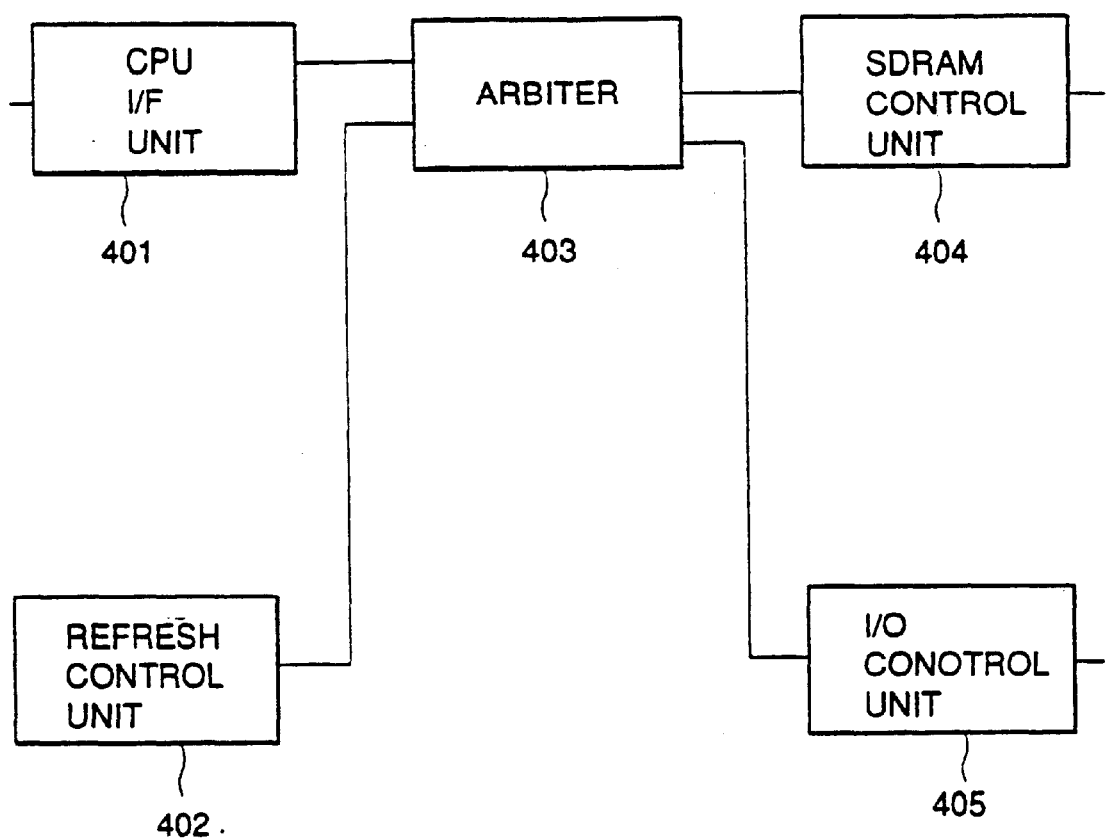
FIG. 4 shows an internal block diagram of an ASIC included in the image forming system shown in FIG. 3.

External access to the CPU 301 is performed via an ASIC 307. FIG. 4 shows an internal block diagram of the ASIC 307 shown in FIG. 3.

In FIG. 4, a CPU interface unit 401 acts as an interface with the CPU 301, and when the CPU 301 outputs an external access request, the CPU interface unit 401 requests a bus using right from an arbiter 403. When the bus using right is thus obtained, the CPU interface unit 401 starts services to the CPU 301.

A refresh control unit 402, having an internal counter, sends a refresh request to the arbiter 403 when the internal counter reaches a predetermined number.

The arbiter 403 performs arbitration between requests sent from the CPU interface unit 401 and the refresh control unit 402. The arbiter 403 then outputs predetermined instructions to an SDRAM control unit 404 and an I/O control unit 405 depending on contents of the requests from the CPU interface unit 401 and the refresh control unit 402.

The SDRAM control unit 404 performs predetermined services for a access request and a refresh request to the SDRAM. In the SDRAM control unit 404, an internal power-down control register is provided. Thereby, it is possible to activate and deactivate the power-down mode, and invalidate a refresh request for a specific area in the SDRAM.

The I/O control unit 405 performs predetermined services for access requests for an I/O space which is an address space of devices other than the SDRAM.

Figure 5:
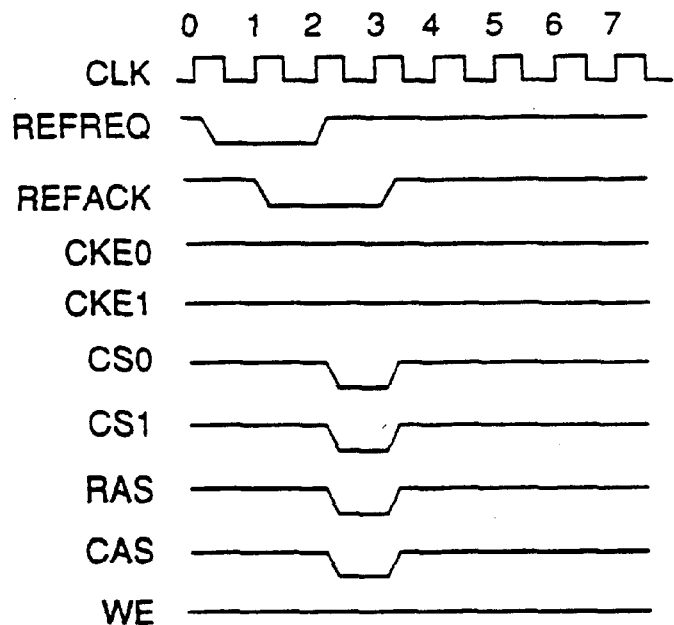
FIG. 5 shows timing charts for an ordinary refreshing operation.

FIG. 5 shows timing charts of an ordinary refreshing operation. The refresh control unit 402 causes a REFREQ signal to be at a low level at a '0'th clock pulse of a clock signal CLK, thus outputting the refresh request. The arbiter 403, receiving the refresh request, then confirms that the SDRAM control unit 404 is in a state in which the unit 404 can accept the refresh request and determines that no other higher priority request is present. Then, the arbiter 403 indicates, by causing a REFACK signal to be at a low level at a '1'st clock pulse of the clock signal CLK, that the refresh request has been acknowledged. The refresh control unit 402, at a '2'nd clock pulse of the clock signal CLK, recognizes that the refresh request has been acknowledged and then negates the refresh request by causing the REFREQ signal to be at a high level.

The SDRAM control unit 404 determines the low level of the REFACK signal and then outputs a refresh command to the SDRAM. In this case, because the internal power-down control register of the SDRAM control unit 404 has not yet indicated the power-down mode, the SDRAM control unit 404 causes two CS0 and CS1 signals to be at a low level, two RAS and CAS signals to be at a low level, and a WE signal to be at a high level. Thus, the SDRAM control unit 404 outputs the refresh command such that the entire area (in the fourth embodiment, including two banks) of the SDRAM may be refreshed. Thus, the two banks of the SDRAM are simultaneously refreshed in the fourth embodiment. However the refreshing operation is not limited to this manner as it is also possible to perform the refreshing operations separately. Clock enable signals CKE0 and CKE1 which are provided for the two banks, bank 0 and bank 1 respectively, are always fixed to be at a high level, as shown in FIG. 5.

In the fourth embodiment, a 32-bit data bus is formed for each bank using four SDRAM chips, each having a 8-bit bus width. Therefore, eight SDRAM chips are used for providing two banks.

Figure 6:
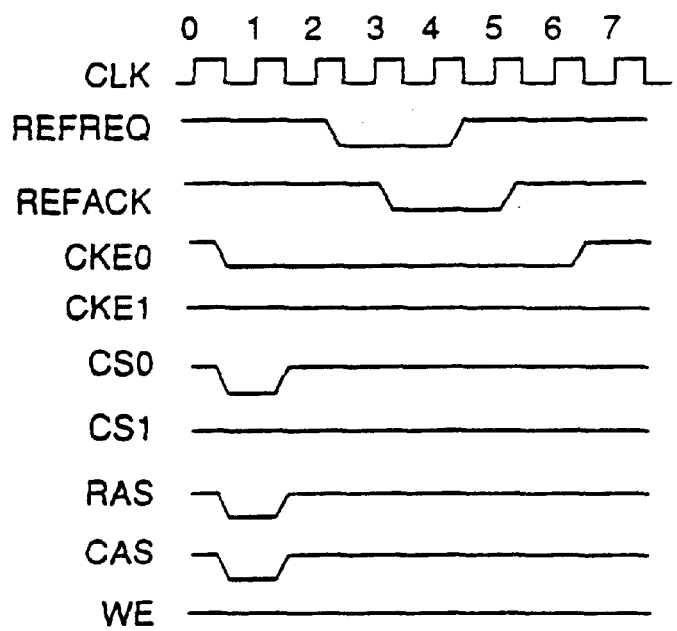
FIG. 6 shows timing charts for another refreshing operation.

FIG. 6 shows a case in which only the bank 0 of the SDRAM enters the power-down mode. The bank 0 of the SDRAM stores data which should be maintained. For maintaining the stored data, a self-refreshing operation is automatically performed on the bank 0 of the SDRAM. Therefore, the refresh request which is given externally is invalidated. Power required for a refreshing operation through the self-refreshing operation is extremely small in comparison to power required for the refreshing operation through the external refresh request. In contrast to this, bank 1 of the SDRAM, which is not storing data to be maintained, a refreshing operation is not performed in order to reduce power consumption.

By causing the RAS, CAS, CS0, CKE0 signals to be at a low level at a '0'th clock pulse of the clock signal CLK, the power-down mode is activated in a self-refreshing state. The clock enable signal CKE1 for the bank 1 of the SDRAM is always fixed to be at a high level as shown in FIG. 6. The above-mentioned self-refreshing state is a state in which refreshing of the SDRAM is controlled not by any external refresh command but is controlled by an internal procedure.

At a '2'nd clock pulse of the clock signal CLK, the refresh control unit 402 outputs a refresh request and the arbiter acknowledges this refresh request at a '3'rd clock pulse. However, because the internal power-down control register of the SDRAM control unit 404 indicates the power-down mode, the arbiter does not output a refresh command. Not shown in FIG. 6, at a '6'th clock pulse, the CPU 301 writes data on the internal power-down control register such that the internal power-down control register cancels indication of the power-down mode. As a result, the clock enable signal CKE0 goes to a high level and thus a command instructing that the power-down mode be deactivated is issued.

Thus, in the case of FIG. 6, the bank 0 of the SDRAM is a bank for which the power-down mode may be activated. The bank 1 is a bank on which no refreshment is performed and for which the power-down mode is not activated. Therefore, it is possible to reduce a load for which the clock enable signal CKE is supplied for activating the power-down mode. Further, it is possible to reduce power consumption for bank 1 although the power-down mode is not activated for bank 1. By omitting refreshment of bank 1, data stored in bank 1 may not be guaranteed. However, no problem occurs thereby because bank 1 is a bank which at least at this time does not store data to be maintained as mentioned above. If bank 1 is used for storing data to be maintained, bank 1 may be cleared before using it.

Thus, according to the present invention embodied in the fourth embodiment, refreshment of the SDRAM is performed such that only a part of the SDFAM is refreshed. As a result, it is possible to reduce power consumption for the memory refreshment. Thus, the advantage (power consumption reduction)similar to that obtained when the power-down mode is used can be obtained by reducing the refreshment amount of the SDRAM without using the power-down mode.

Further, by reducing the area in the SDRAM for which the power-down mode is used, it is possible to considerably reduce the amount of hardware and a number of signal wires for carrying the CKE signals for activating the power-down mode, the wave quality of the signals being essential. Further, it is possible to activate the power-down mode for an area of the SDRAM for which data stored therein should be kept.

Figure 7:
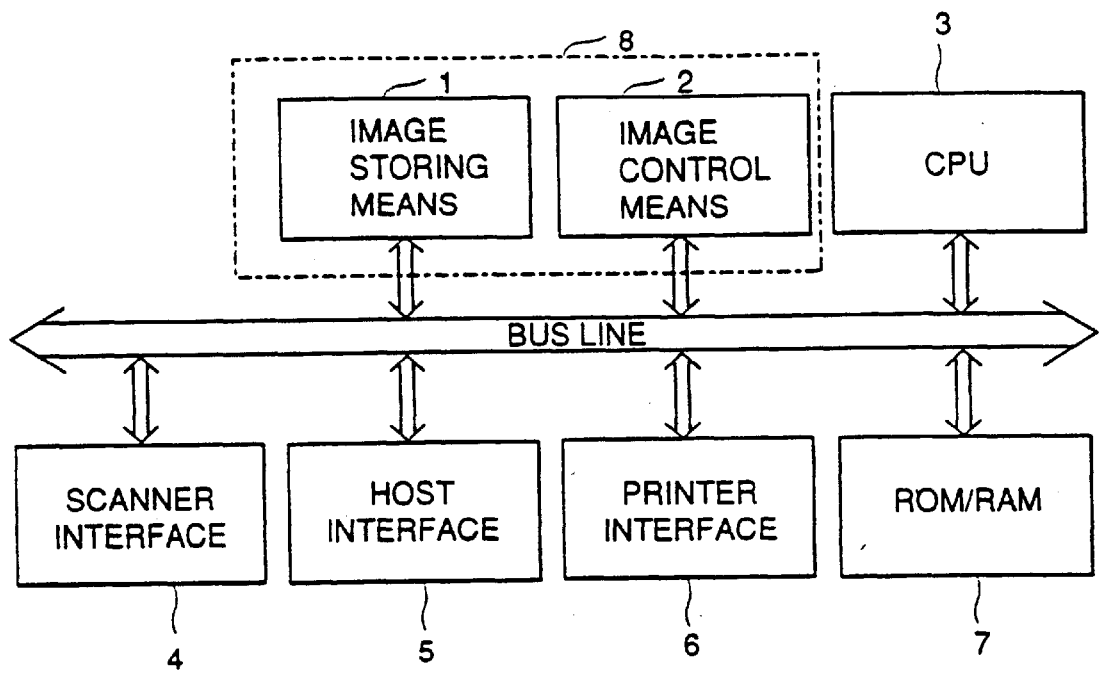
FIG. 7 shows a block diagram of an image forming system in a fifth embodiment of the present invention.

FIG. 7 shows a block diagram of an image forming system in a fifth embodiment of the present invention. An image control system includes image storing means 1 and image control means 2. The image forming system further includes a CPU 3 for controlling the entirety of the system, a scanner interface 4, a host interface 5, a printer interface 6, and a ROM/RAM 7. The interfaces 4, 5, 6 and ROM/RAM 7 are connected to the image control system 8 and CPU 3 via a bus line.

Operation of the image forming system shown in FIG. 7 will now be described. By instructions from the CPU 3, image information read in through an external device such as a scanner is input via the scanner interface 4. Then, the input image information is sent via the bus line and then stored in a previously allocated specific position in the image storing means. Further, image information input from a host apparatus such as a personal computer via the host interface 5 is also sent via the bus line and then stored in a previously allocated specific position in the image storing means.

Further, the image storing means 1 includes a plurality of SDRAM chips suitable for storage of image information, it being needed to process a large amount of the image information at high speed. Different from SRAM, the SDRAM needs refreshing at predetermined time intervals so as to keep data stored therein. For this purpose, the image control means 2 performs an appropriate control operation for the periodical refreshment.

The image control means 2, which receives image forming instructions from the CPU 3, reads the image information stored in the image storing mean 1 and outputs it to an external image forming apparatus such as a printer via the printer interface 6 at an appropriate time so that the external image forming apparatus can correctly receive the output image information. A ROM of the ROM/RAM 7 stores programs which the CPU 3 executes and various parameters which are used for control of the entirety of the system. A RAM of the ROM/RAM 7 is used for such purpose as temporarily storing data which results from the program execution by the CPU 3.

Figure 8:
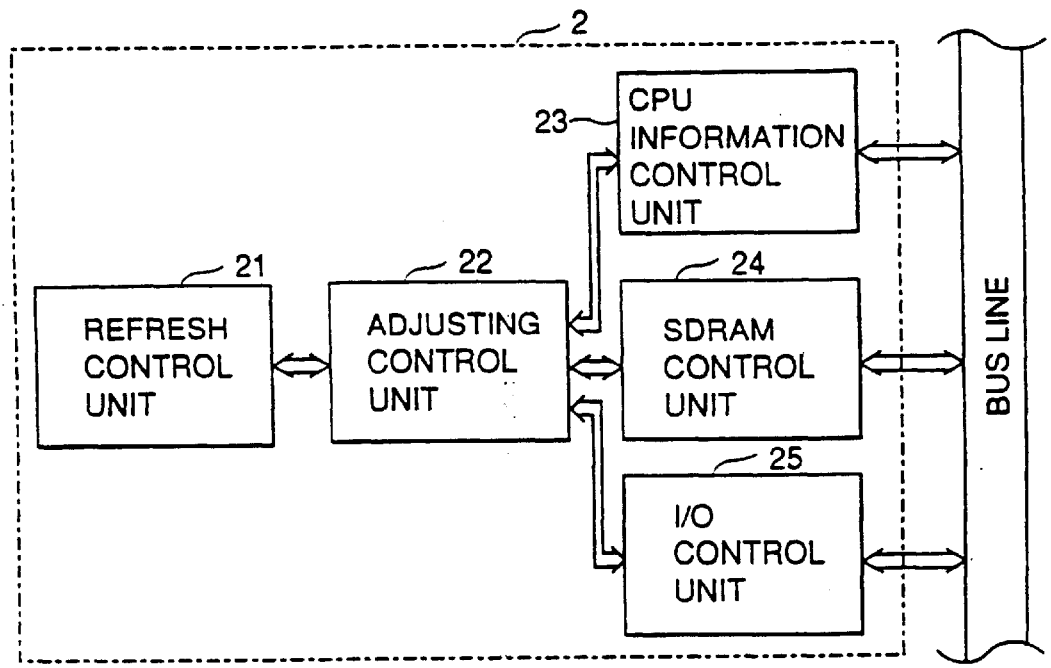
FIG. 8 shows a block diagram of an image control means included in the image forming system shown in FIG. 7.

FIG. 8 shows a detailed block diagram of the image control means 2 shown in FIG. 7. A CPU information control unit 23 receives refresh request instructions from the CPU 3 via the bus line, and sends the instructions to an adjusting control unit 22. The adjusting control unit 22 monitors the state in which each input/output units uses or does not use the bus line via an I/O control unit 25. When receiving a refresh signal from a refresh control unit 21, the adjusting control unit 22 confirms, via a SDRAM control unit 24, that the image storing means 1 is not in a state in which data is being written in the image storing means 1. Then, the adjusting control unit 22 responds to the refresh signal and thus performs a refreshing operation of the image storing means 1 via the SDRAM control unit 24. The SDRAM control unit 24 has therein a refresh position control register and, thereby, can perform the refreshing operation only on a specific area of the image storing means 1 according to a determination of the adjusting control unit 22. ordinarily, the image control means 2 is formed in an ASIC chip.

Figure 10:
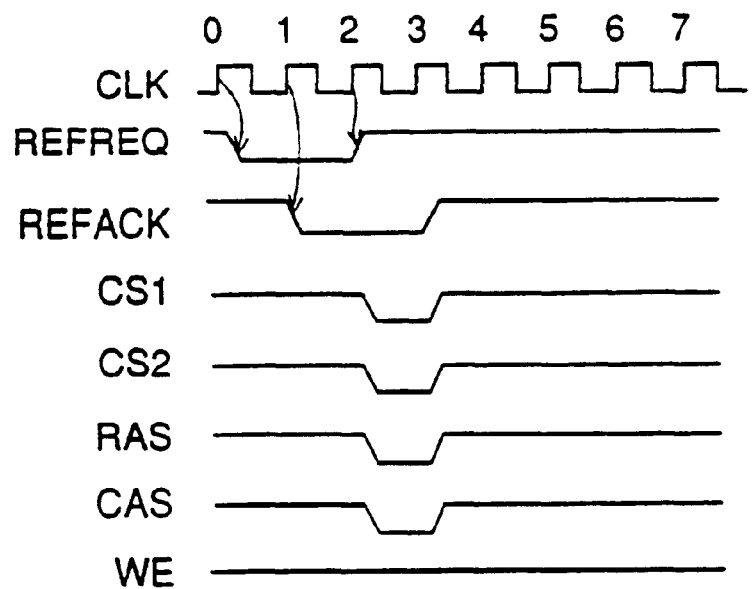
FIG. 10 shows timing charts of a refreshing operation in the image control means shown in FIG. 8.
Figure 11:
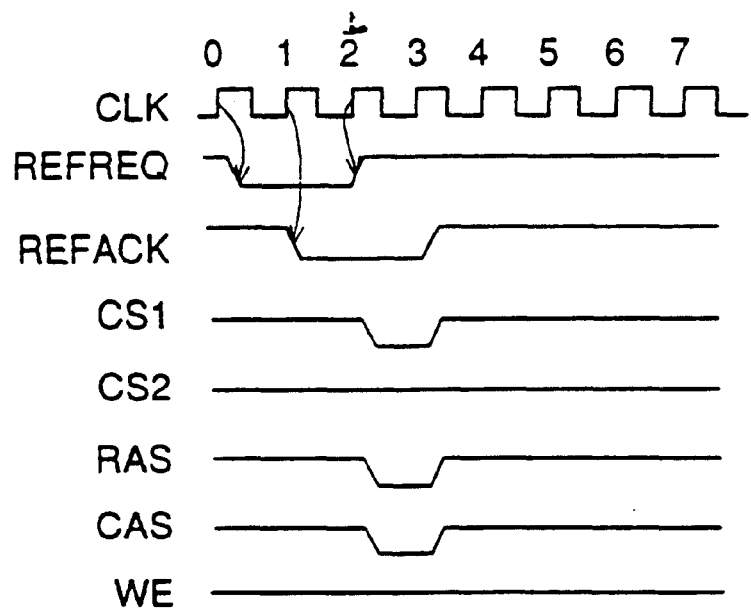
FIG. 11 shows timing charts of another refreshing operation in the image control means shown in FIG. 8.

FIGS. 10 and 11 show examples of timing charts of such a refreshing operation. The refresh control unit 21 previously has information indicating a position at which image information is stored and a time at which the image information is stored at the position. Based on the information, the refresh control unit 21 causes a REFREQ signal to be at a low level for requesting the refreshing operation at a '0'th clock pulse of a clock signal CLK as shown in FIGS. 10 and 11. The adjusting control unit 22 recognizes this level change of the REFREQ signal. The adjusting control unit 22 regularly monitors a state of the SDRAM via the SDRAM control unit 24. Therefore, the adjusting control unit 22 confirms that the SDRAM is in a state in which the SDRAM can accept a request for the refreshing operation after recognizing the level change of the REFREQ signal indicating requesting of the refreshing operation. Further, the adjusting control unit 22 also confirms that there is no other higher-priority request. After the confirmation has been achieved, the adjusting control unit 22 causes a REFACK signal to be at a low level for permitting the request for the refreshing operation at a '1'st clock pulse of the clock signal CLK as shown in FIGS. 10 and 11.

The refresh control unit 21, when recognizing the level change of the REFACK signals, causes the REFREQ signals to be at a high level. The refresh control unit 21 then causes two RAS and CAS signals to be at a low level as shown in the figures. Simultaneously, the refresh control unit 21 causes one or two of CS1 and CS2 signals to be at a low level for validating those level change of the RAS and CAS signals.

Figure 9:
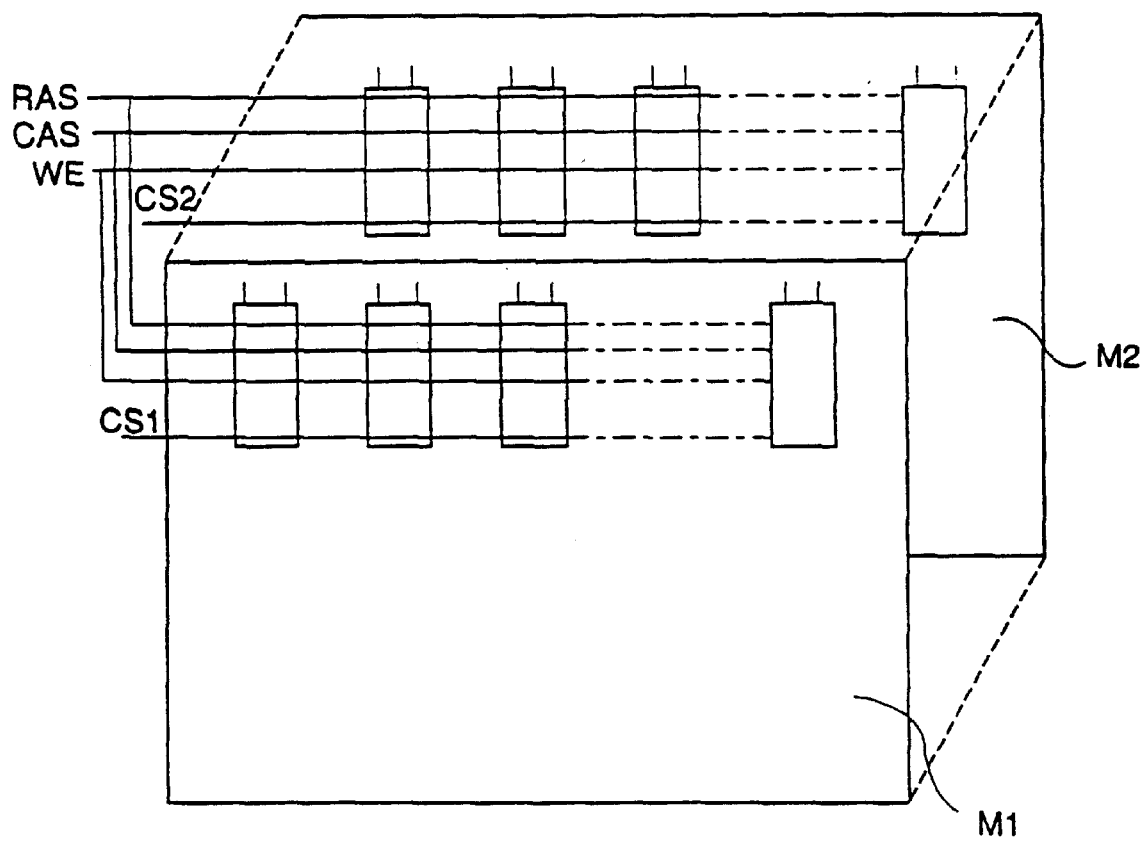
FIG. 9 shows a structure of an SDRAM used in image storing means of the image control system included in the image forming system shown in FIG. 7.

As shown in FIG. 9, the SDRAM includes two banks, namely, M1 and M2. If two of the CS1 and CS2 signals are at the low level at this time together with the level change of the RAS and CAS signals, the refreshing operation is performed on the two banks of the SDRAM. If only one, namely, a signal CS1 is at the low level at that time together with the level change of the RAS and CAS signals, the refreshing operation is performed only on the bank M1 of the SDRAM.

Thus, it is possible to refresh only a part of the SDRAM which stores image information. Further, it is also possible to refresh the other remaining part of the SDRAM at another time if it is necessary. Thus, it is not necessary to refresh the entirety of the SDRAM at the same time, and thus it is possible to considerably reduce a maximum instantaneous load electric current for the refreshing operation. As a result, it is possible to reduce costs for a power supply device and also reduce size of the entire system. Further, a miniature, low-cost image control system including a reduced number of memory elements can be provided in comparison to using a SRAM.

Another example of defining a part of the SDRAM to be refreshed will now be described. For example, there may be a case where the SDRAM, which has a storage capacity for storing image information, corresponding to an A3 size image, is used for storing image information corresponding to an A4 size image. In such a case, only a part of the SDRAM corresponding to an A4 size image is used for storing the image information. Therefore, by performing the refreshing operation only on the part used, it is possible to provide not only a maximum instantaneous load electric current but also total power consumption for the refreshing operation can be effectively reduced. Thus, it is possible to provide the image control system by which not only a maximum instantaneous load electric current but also total power consumption for the refreshing operation can be effectively reduced.

If a part of the SDRAM is not refreshed for a time longer than the predetermined time interval, contents of information stored in that part of the SDRAM is not be guaranteed. However, no problem occurs thereby because this part of the SDRAM, at this time, does not store data to be maintained. If this part of the SDRAM is used for storing data to be maintained, the part may be cleared before using it.

As described above, there is a method of using the power-down mode for the SDRAM, by which power consumption can be reduced. The clock enable signal CKE which is used for invalidating a clock pulse of the clock signal CLK is used for activating the power-down mode. In order to effectively use the power-down mode, as mentioned above, the CKE signal should be controlled at high speed with a timing having a certain relationship with the timing of the clock signal CLK. However, in order to apply this method, it is necessary to appropriately distinguish an SDRAM, for which the power-down mode is activated, from an SDRAM for which the power-down mode is not activated.

Further, as mentioned above, it is also necessary to have high speed control of the CKE signal for the SDRAM for which the power-down mode is activated. A construction for controlling such a distinguishing operation and a high-speed signal control operation is complicated. Further, it is necessary to provide many signal wires for carrying the CKE signals, and thus a stray capacitance due to the signal wires is large. Therefore, it is necessary to perform countermeasures for preventing degradation of wave quality of the signals flowing through the signal wires.

Further, different from cases for the RAS and CAS signals, for the CKE signal, a set-up time and a hold time for a rising edge of a relevant pulse of the CLK signal is strictly prescribed. Therefore, in order to supply the CKE signals, it is necessary to externally provide a high-speed buffer or a circuit for performing an appropriate synchronizing operation of the CKE signals.

In contrast to this method, according to the present invention embodied in the fifth embodiment, power-consumption reduction is achieved by controlling the refreshing operation. Thereby, power-consumption reduction can be positively achieved by a simple construction.

Further, the present invention is not limited to the above described embodiments, and variations and modifications may be made without departing from the scope of the present invention.

What is claimed is:

1. An image processing system comprising:
a plurality of memory elements each capable of storing image information; and
refreshing means for refreshing only a selected part of said plurality of memory elements,
wherein said selected part of said plurality of memory elements comprises a part which currently is storing said image information, and wherein a part of the plurality of memory elements which currently is not storing the image information is not refreshed.

2. The image processing system according to claim 1, wherein said plurality of memory elements comprise a plurality of synchronous dynamic random access memories.

3. The image processing system according to claim 1, wherein said image information is produced based on image information input through a scanner device.

4. The image processing system according to claim 1, wherein said image information is produced based on image information input from a host apparatus.

5. An image processing system as recited in claim 1, wherein the refreshing means refreshes, at a predetermined time, a selected part of the plurality of memory elements, and refreshes, at another time, a part or all of the other part of the plurality of memory elements.

6. An image processing system comprising:
a plurality of memory elements each capable of storing image information;
refreshing means for refreshing only a selected part of said plurality of memory elements; and
a controller controlling said plurality of memory elements to cause only a selected part of said plurality of memory elements to enter a power-down mode,
wherein said selected part of said plurality of memory elements comprises a part which currently is storing said image information.

7. An image processing system comprising:
a plurality of memory elements each capable of storing image information; and
a refreshing circuit for refreshing only a selected part of said plurality of memory elements,
wherein said part of said plurality of memory elements comprises a part which currently is storing said image information, image information is not refreshed.

8. The image processing system according to claim 7, wherein said plurality of memory elements comprise a plurality of synchronous dynamic random access memories.

9. The image processing system according to claim 7, wherein said image information is produced based on image information input through a scanner device.

10. The image processing system according to claim 7, wherein said image information is produced based on image information input from a host apparatus.

11. An image processing system as recited in claim 7, wherein the refreshing circuit refreshes, at a predetermined time, a selected part of the plurality of memory elements, and refreshes, at another time, a part or all of the other part of the plurality of memory elements.

12. An image processing system comprising:
a plurality of memory elements each capable of storing image information;
a refreshing circuit for refreshing only a selected part of said plurality of memory elements; and
a controller controlling said plurality of memory elements to cause only a selected part of said plurality of memory elements to enter a power-down mode,
wherein said part of said plurality of memory elements comprises a part which currently is storing said image information.

13. An image processing method comprising:
providing a plurality of memory elements each capable of storing image information; and
refreshing only a selected part of said plurality of memory elements,
wherein said part of said plurality of memory elements comprises a part which currently is storing said image information and wherein a part of the plurality of memory elements which is not currently storing the image information is not refreshed.

14. An image processing method as recited in claim 13, wherein the refreshing refreshes, at a predetermined time, a selected part of the plurality of memory elements, and refreshes, at another time, a part or all of the other part of the plurality of memory elements.

15. An image processing system comprising:
a plurality of memory elements each capable of storing image information; and
refreshing means for refreshing, at a predetermined time, a selected part of the plurality of memory elements, and refreshing, at another time, a part or all of the other part of the plurality of memory elements.

16. An image processing system comprising:
a plurality of memory elements each capable of storing image information; and
a refreshing circuit for refreshing, at a predetermined time, a selected part of the plurality of memory elements, and refreshing, at another time, a part or all of the other part of the plurality of memory elements.

17. An image processing method comprising:

providing a plurality of memory elements each capable of stroring image information; and refreshing, at a predetermined time, a selected part of the plurality of memory elements, and refreshing, at another time, a part or all of the other part of the plurality of memory elements.

* * * * *